(12) United States Patent
    Hsu et al.

(10) Patent No.: US 10,553,265 B2
(45) Date of Patent: Feb. 4, 2020

(54) MEMORY CIRCUIT HAVING TRACKING CIRCUIT INCLUDING SERIES-CONNECTED TRANSISTORS

(71) Applicant: TAIWAN SEMICONDUCTOR MANUFACTURING COMPANY, LTD., Hsinchu (TW)

(72) Inventors: Kuoyuan (Peter) Hsu, San Jose, CA (US); Jacklyn Chang, San Roman, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/206,314

(22) Filed: Nov. 30, 2018

(65) Prior Publication Data

US 2019/0096457 A1    Mar. 28, 2019

Related U.S. Application Data

(60) Continuation of application No. 15/923,476, filed on Mar. 16, 2018, now Pat. No. 10,163,476, which is a division of application No. 14/666,371, filed on Mar. 24, 2015, now Pat. No. 9,934,833.

(51) Int. Cl.
| | | |
|---|---|---|
| *G11C 7/22* | (2006.01) |
| *G11C 7/14* | (2006.01) |
| *G11C 29/50* | (2006.01) |
| *G11C 7/12* | (2006.01) |
| *G11C 11/404* | (2006.01) |
| *G11C 11/4094* | (2006.01) |

(52) U.S. Cl.
CPC ............... *G11C 7/227* (2013.01); *G11C 7/14* (2013.01); *G11C 29/50016* (2013.01); *G11C 7/12* (2013.01); *G11C 11/4045* (2013.01); *G11C 11/4094* (2013.01)

(58) Field of Classification Search
CPC .. G11C 7/227; G11C 7/12; G11C 7/14; G11C 29/50016; G11C 11/4045; G11C 11/4094
USPC ........................................................ 365/72
See application file for complete search history.

(56) References Cited

U.S. PATENT DOCUMENTS

| | | | | |
|---|---|---|---|---|
| 5,724,294 A | * | 3/1998 | Khieu | ................... G11C 7/06 365/190 |
| 7,859,920 B2 | | 12/2010 | Jung et al. | |

(Continued)

*Primary Examiner* — Gene N Auduong
(74) *Attorney, Agent, or Firm* — Hauptman Ham, LLP

(57) ABSTRACT

A memory circuit including: memory cells, each including a storage cell transistor; a first tracking bit line; and a tracking circuit, electrically coupled between a first tracking word line and a reference voltage node, including a first set of first tracking cells, each first tracking cell including a first cell transistor having a same transistor configuration as each storage cell transistor; and wherein: a driving capacity of the storage cell transistors of the memory cells has a storage cell statistical distribution that exhibits a weak bit current value; a driving capacity of the first cell transistors of the first set of tracking cells has a first tracking cell statistical distribution that exhibits a first strong bit current value; and a first quantity of the first tracking cells is sufficient to cause the first strong bit current value to be equal to or less than the weak bit current value.

20 Claims, 12 Drawing Sheets

(56) References Cited

U.S. PATENT DOCUMENTS

| | | | |
|---|---|---|---|
| 8,040,746 B2* | 10/2011 | Jain | G11C 7/22 |
| | | | 365/203 |
| 8,315,085 B1 | 11/2012 | Chang et al. | |
| 8,320,210 B2* | 11/2012 | Narayanaswamy | G11C 7/12 |
| | | | 365/185.2 |
| 8,477,527 B2 | 7/2013 | Wang et al. | |
| 8,559,209 B2* | 10/2013 | Siau | G11C 8/08 |
| | | | 365/148 |
| 8,605,523 B2 | 12/2013 | Tao et al. | |
| 8,929,160 B2 | 1/2015 | Katoch et al. | |
| 8,934,308 B2* | 1/2015 | Wang | G11C 11/419 |
| | | | 365/191 |
| 8,958,237 B1 | 2/2015 | Yang et al. | |
| 8,964,492 B2 | 2/2015 | Hsu et al. | |
| 8,976,614 B2 | 3/2015 | Zhang et al. | |
| 9,105,328 B2 | 8/2015 | Chiu et al. | |
| 9,311,968 B2 | 4/2016 | Hong et al. | |
| 9,934,833 B2 | 4/2018 | Hsu et al. | |
| 10,163,476 B2* | 12/2018 | Hsu | G11C 29/50016 |
| 2010/0284232 A1 | 11/2010 | Wang | |
| 2012/0008438 A1* | 1/2012 | Jain | G11C 7/22 |
| | | | 365/194 |
| 2013/0163312 A1 | 6/2013 | Chang | |
| 2013/0215693 A1 | 8/2013 | Tao et al. | |
| 2014/0010032 A1* | 1/2014 | Seshadri | G11C 7/12 |
| | | | 365/203 |
| 2014/0036608 A1 | 2/2014 | Chiu et al. | |
| 2015/0092502 A1 | 4/2015 | Yang et al. | |

* cited by examiner

MEMORY CIRCUIT HAVING TRACKING CIRCUIT INCLUDING SERIES-CONNECTED TRANSISTORS

PRIORITY CLAIM

The present application is a continuation of U.S. application Ser. No. 15/923,476, filed Mar. 16, 2018, the latter being a divisional of U.S. application Ser. No. 14/666,371, filed Mar. 24, 2015, now U.S. Pat. No. 9,934,833, granted Apr. 3, 2018, each of which is incorporated herein by reference in its entirety.

BACKGROUND

In a memory circuit, a weak memory cell refers to a memory cell having a cell current that is determined as the worst read margin among the memory cells of the memory circuit. In some applications, based on a statistical analysis of cell currents of the memory cells, the weak memory cell is determinable as the memory cell corresponding to a predetermined multiple of standard deviations less than an average cell current (e.g., −3σ, −4σ, −5σ or −6σ, etc.). In a read operation, a tracking signal is generated to provide a signal indicating a waiting period sufficient for a successful read operation of the weak memory cell. The waiting period is thus also applicable to reading other memory cells having cell currents greater than that of the weak memory cell.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
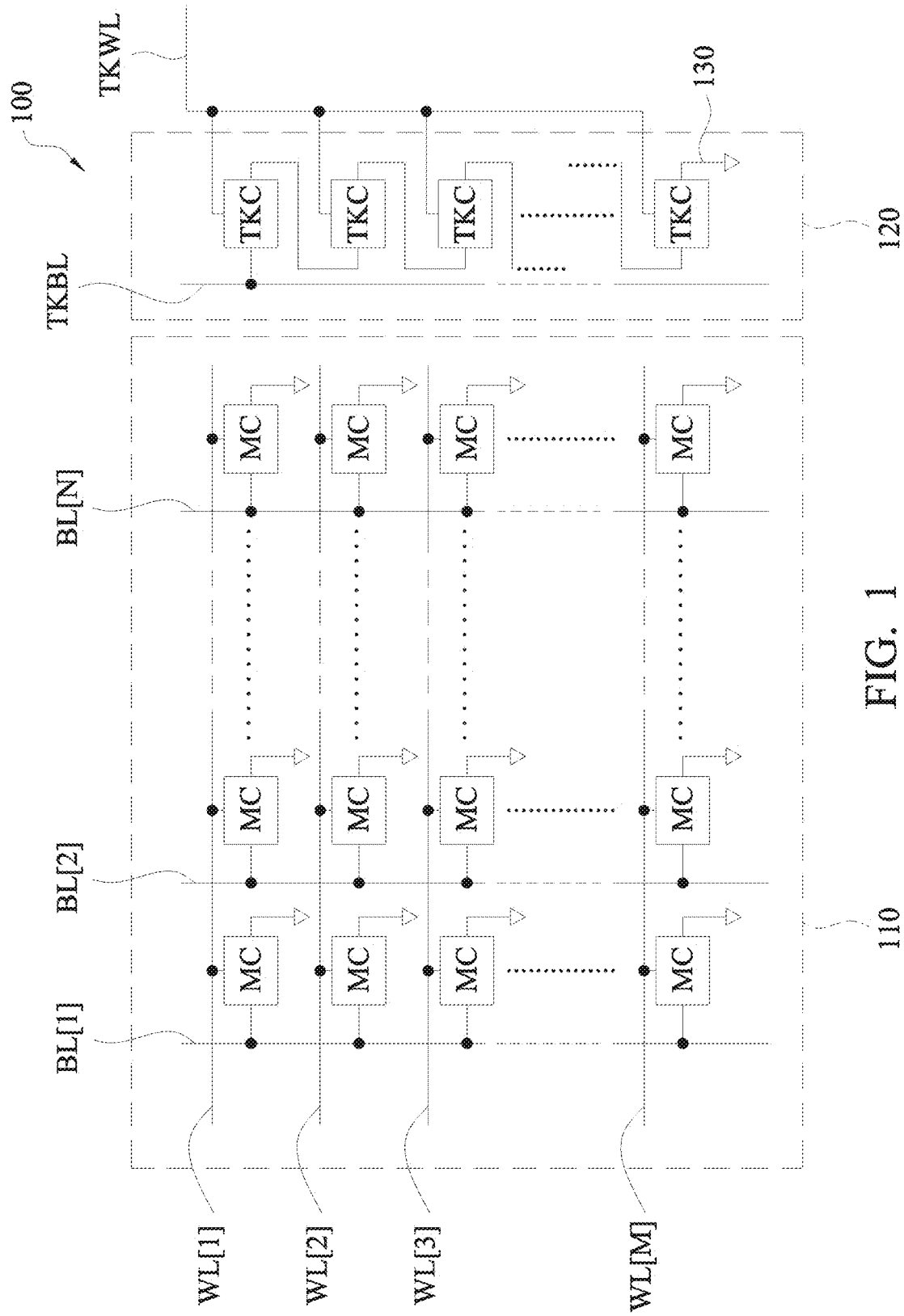
FIG. 1 is a block diagram of a portion of a memory circuit in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a tracking circuit includes series-connected transistors that collectively function as a long-channel transistor configured to model a cell transistor of a weak memory cell. In some embodiments, the tracking circuit according to the present disclosure uses only one tracking bit line as the load device for the tracking circuit. In some embodiments, the tracking circuit according to the present disclosure uses no more than one column of tracking cells in the memory circuit.

FIG. 1 is a block diagram of a portion of a memory circuit 100 in accordance with some embodiments. Memory circuit 100 is a read-only memory (ROM), and is used for illustration. Other types of memory circuits, such as programmable read-only memory (PROM), resistive random-access memory (RRAM), or the like, are within the scope of various embodiments.

Memory circuit 100 includes a memory array 110 and a tracking circuit 120. Memory array 110 includes a plurality of memory cells MC, M number of word lines WL[1], WL[2], WL[3], . . . , WL[M], and N number of bit lines BL[1], BL[2], . . . , BL[N]. M and N are integers greater than 1. Each memory cell of the plurality of memory cells MC includes a cell transistor (e.g., transistor 230 in FIGS. 2A-2C) corresponding to a predetermined transistor configuration. Details of memory cells MC will be illustrated in conjunction with FIGS. 2A-2C.

Tracking circuit 120 includes a plurality of tracking cells TKC, a tracking bit line TKBL, and a tracking word line TKWL. Each tracking cell of the plurality of tracking cells TKC includes a cell transistor (e.g., transistor 312[1], 312[2], or 312[X] in FIG. 3) corresponding to the predetermined transistor configuration.

In some embodiments, tracking bit line TKBL and the N bit lines BL[1], BL[2], . . . , BL[N] are fabricated based on layout patterns having the same size and shape. Therefore, the resulting tracking bit line TKBL and bit lines BL[1], BL[2], . . . , BL[N] have comparable dimensions.

Memory cells MC and tracking cells TKC are arranged into rows and columns. In some embodiments, cell transistors of memory cells MC and tracking cells TKC thus are also arranged into rows and columns. The memory cells of the same row are electrically coupled with a corresponding word line WL[1], WL[2], WL[3], or WL[M]. The memory cells of the same column are electrically coupled with a corresponding bit line BL[1], BL[2], or BL[N]. The cell transistors of a sub-set of tracking cells TKC are electrically coupled in series between tracking bit line TKBL and a voltage reference node 130. Also, the cell transistors of the sub-set of tracking cells TKC are electrically coupled with the tracking word line TKWL. Voltage reference node 130 is configured to carry a reference voltage. In some embodiments, the reference voltage has a voltage level recognizable as 0 volt in memory circuit 100. In some embodiments, the reference voltage is referred to as a ground or VSS of memory circuit 100. Details of tracking circuit 120 will be illustrated in conjunction with FIG. 3. Some example variations of tracking circuit 120 will be illustrated in conjunction with FIGS. 6A-6C.

Only one column of tracking cells TKC is depicted in FIG. 1. In some embodiments, two or more columns of tracking cells TKC are in tracking circuit 120. In some embodiments, the two or more columns of tracking cells TKC are evenly spread out among the columns of memory cells MC. In some embodiments, memory circuit 100 includes additional tracking cells TKC that are not configured as part of the tracking circuit 120.

Figure 2A:
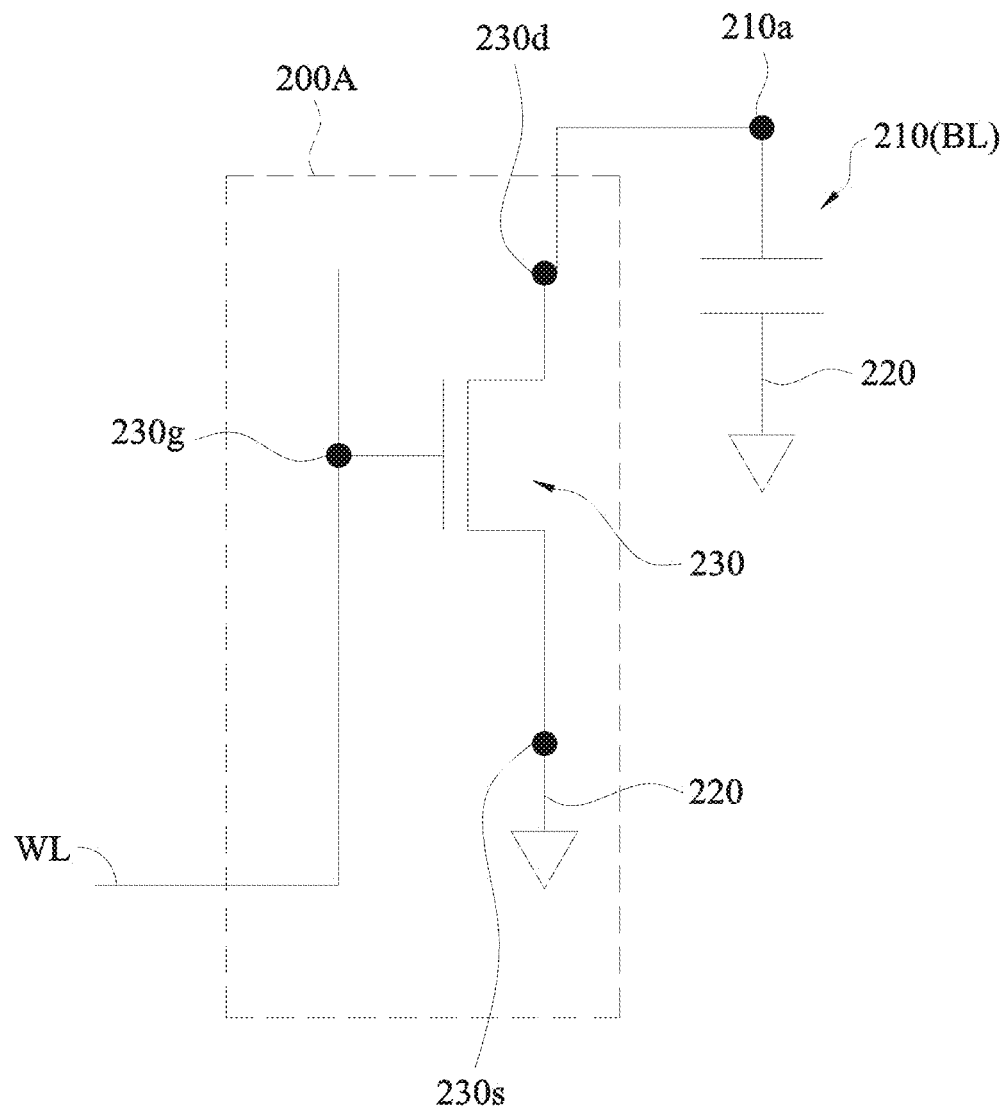
FIG. 2A is a circuit diagram of a memory cell usable in the memory circuit in FIG. 1 and storing a first logical value in accordance with some embodiments.

FIG. 2A is a circuit diagram of a memory cell 200A usable in the memory circuit 100 in FIG. 1 as a memory cell MC and storing a first logical value in accordance with some embodiments. Memory cell 200A is electrically coupled with a word line WL and a bit line BL. In some embodiments, word line WL corresponds to one of the word lines WL[1], WL[2], WL[3], and WL[M] in FIG. 1. In some embodiments, bit line BL corresponds to one of the bit lines BL[1], BL[2], and BL[N] in FIG. 1. Bit line BL in FIG. 2A is depicted as a capacitive load device 210 observable from the memory cell 200A. Capacitive load device 210 represents at least the parasitic capacitance of bit line BL between a reference voltage node 220 and a node 210a, where memory cell is coupled with bit line BL. Voltage reference node 220 is configured to carry a reference voltage. In some embodiments, reference voltage node 220 corresponds to reference node 130 in FIG. 1.

Memory cell 200A includes a cell transistor 230. Cell transistor 230 is an N-type metal-oxide semiconductor field effect transistor (NMOS transistor). In some embodiments, all cell transistors of memory cells MC and tracking cells TKC are NMOS transistors having the same predetermined transistor configuration. The predetermined transistor configuration refers to the dimensions, materials, structural features, and electrical characteristics of the cell transistor being designed to be the same. However, the actual configurations of the cell transistors vary because of fabrication process variations.

Also, in some embodiments, a P-type transistor or other kinds of N-type transistor are also usable as the cell transistor 230.

Cell transistor 230 includes a gate terminal 230g, a source terminal 230s, and a drain terminal 230d. Gate terminal 230g is coupled with word line WL. Source terminal 230s is coupled with reference voltage node 220. Drain terminal 230d is coupled with bit line BL at node 210a. In a read operation, node 210a is charged to a predetermined pre-charge voltage level different from a predetermined voltage level of the reference voltage at reference voltage node 220. Word line WL is then applied with an activation voltage level sufficient to turn on cell transistor 230. When cell transistor 230 is turned on, a cell current of cell transistor 230 is used to discharge node 210a toward a predetermined reference voltage level of voltage reference node 220. A sensing circuit (not shown) of the memory circuit determines a voltage value stored in memory cell 200A based on a voltage level at the bit line BL after word line WL is activated for a waiting period. In the embodiment depicted in FIG. 2A, memory cell 200A stores a logical value that corresponds to a low resistance state between bit line and reference node 220 when word line WL is applied with the activation voltage level. In some embodiments, the waiting period is determined based on a tracking signal generated by a tracking circuit, such as tracking circuit 120 in FIG. 1.

Figure 2B:
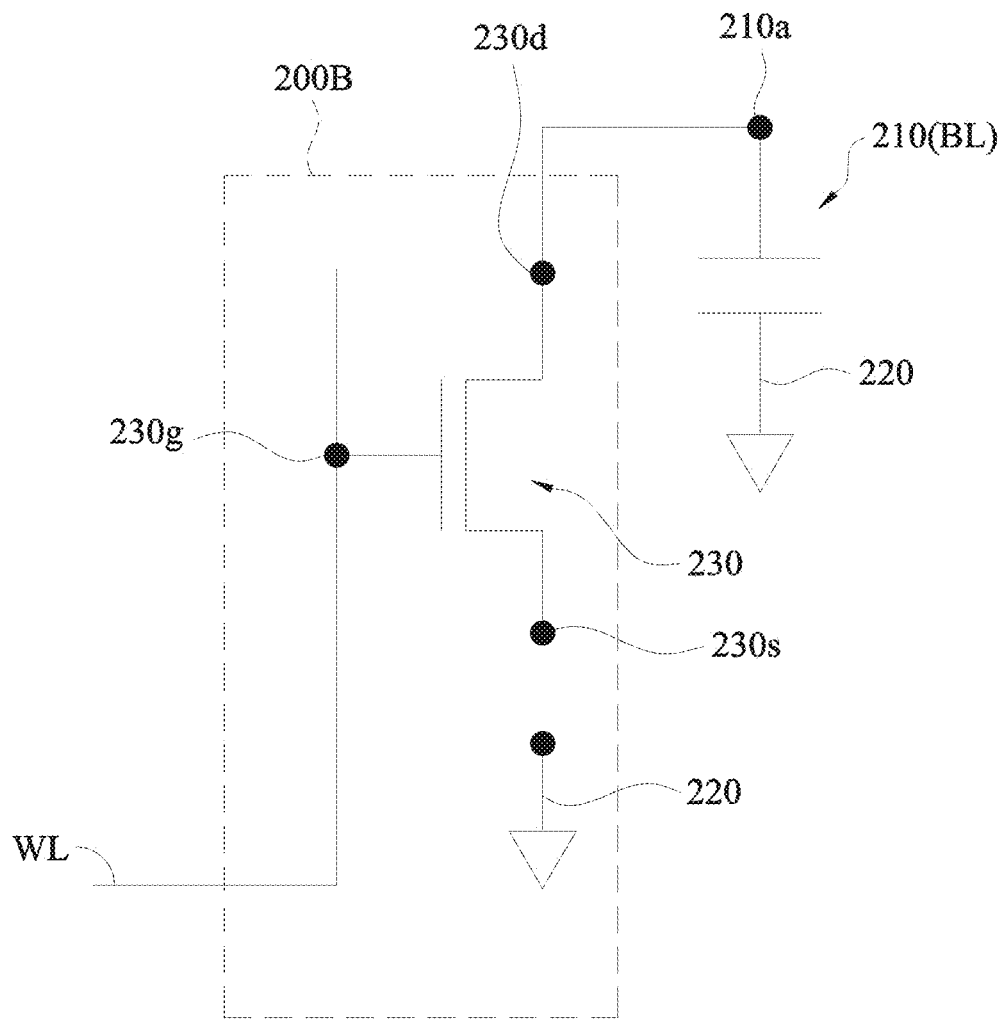
FIG. 2B a circuit diagram of a memory cell usable in the memory circuit in FIG. 1 and storing a second logical value in accordance with some embodiments.

FIG. 2B a circuit diagram of a memory cell 200B usable in the memory circuit in FIG. 1 and storing a second logical value in accordance with some embodiments. Components of memory cell 200B that are the same or similar to those of memory cell 200A in FIG. 2A are given the same reference numbers, and detailed description thereof is thus omitted.

Compared with memory cell 200A, source terminal 230s of memory cell 200B is electrically isolated from reference voltage node 220. In a read operation, after node 210a is charged to the predetermined pre-charge voltage level, word line WL is applied with the activation voltage level. However, because bit line BL and reference voltage node 220 are not electrically coupled through cell transistor 230, transistor 230 is unable to cause a cell current to discharge node 210a toward the predetermined reference voltage level. As a result, after the predetermined waiting period, the voltage level at node 210a remains at a voltage level close to the predetermined pre-charge voltage level. A sensing circuit (not shown) of the memory circuit determines a voltage value stored in memory cell 200B based on a voltage level at the bit line BL after word line WL is activated for a waiting period. In the embodiment depicted in FIG. 2B, memory cell 200B stores a logical value that corresponds to a high resistance state between bit line and reference node 220 when the word line WL is applied with the activation voltage level.

Figure 2C:
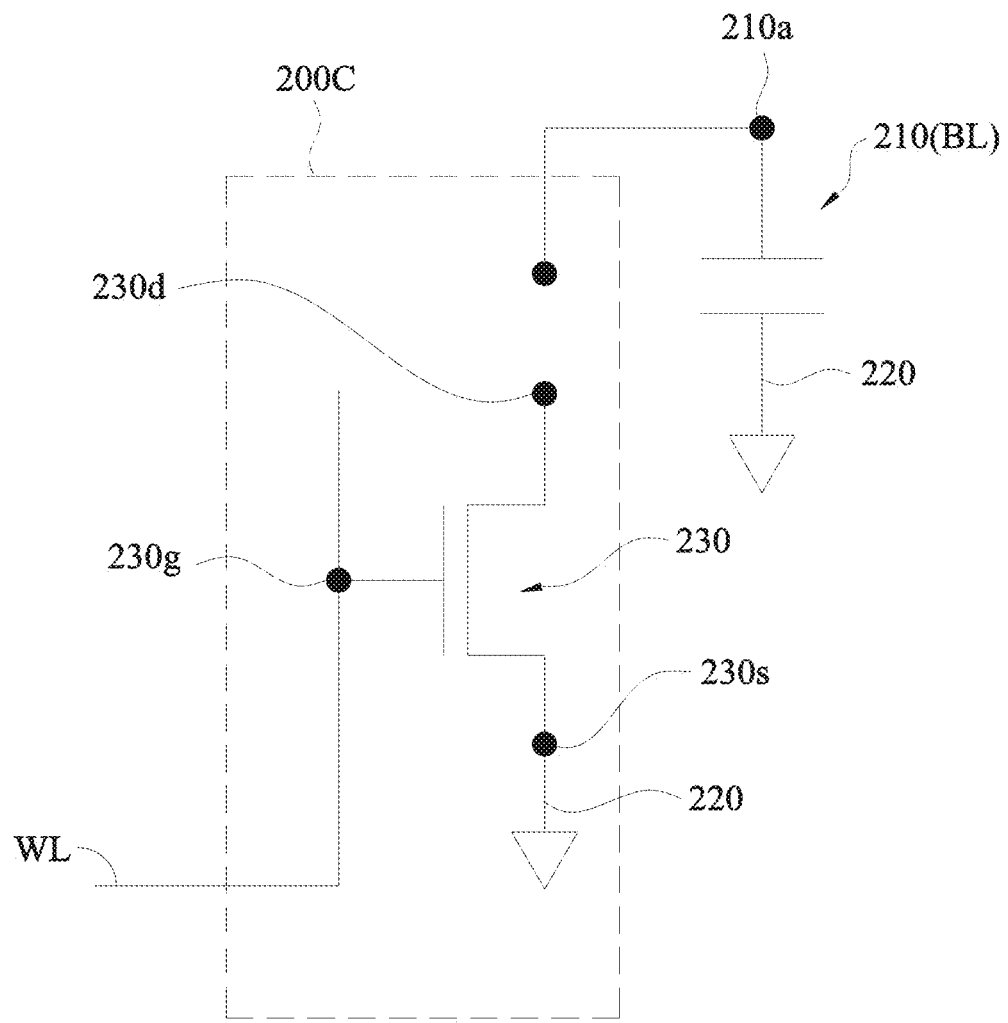
FIG. 2C a circuit diagram of another memory cell usable in the memory circuit in FIG. 1 and storing the second logical value in accordance with some embodiments.

FIG. 2C is a circuit diagram of another memory cell 200C usable in the memory circuit in FIG. 1 and storing the second logical value in accordance with some embodiments. Components of memory cell 200C that are the same or similar to those of memory cell 200B in FIG. 2A and memory cell 200A in FIG. 2A are given the same reference numbers, and detailed description thereof is thus omitted.

Compared with memory cell 200B, source terminal 230s of memory cell 200C is coupled with the reference voltage node 220 and drain terminal 230d of memory cell 200C is electrically isolated from node 210a. In a read operation, after node 210a is charged to the predetermined pre-charge voltage level, word line WL is applied with the activation voltage level. However, because bit line BL and reference voltage node 220 are not electrically coupled through cell transistor 230, transistor 230 is unable to cause a cell current to discharge node 210a toward the predetermined reference voltage level. The operation of memory cell 200C is similar to that of memory cell 200B, and detailed description is thus omitted.

Figure 3:
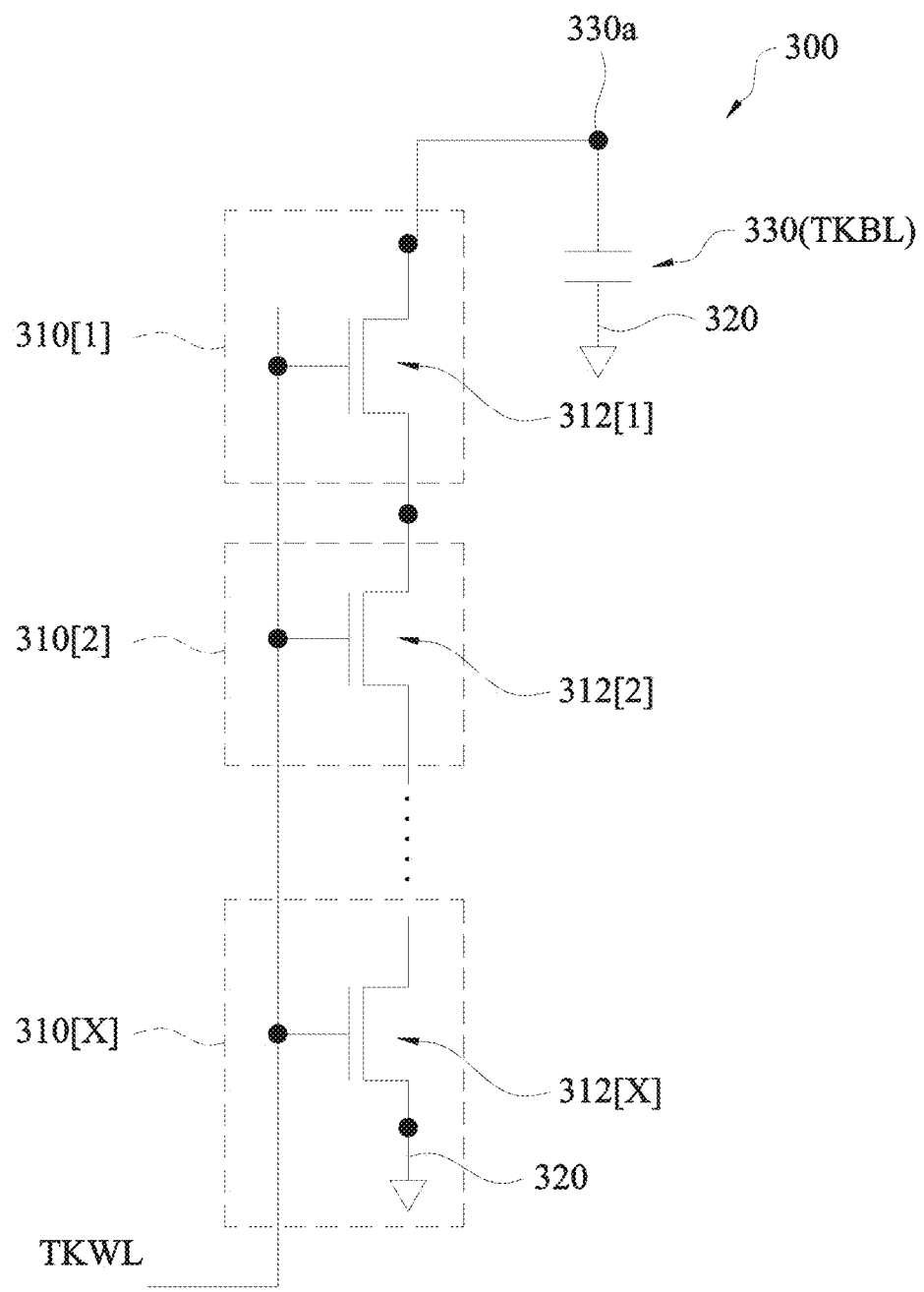
FIG. 3 is a circuit diagram of a tracking circuit usable in the memory circuit in FIG. 1 in accordance with some embodiments.

FIG. 3 is a circuit diagram of a tracking circuit 300 usable in the memory circuit in FIG. 1 in accordance with some embodiments. In some embodiments, tracking circuit 300 corresponds to tracking circuit 120 in FIG. 1.

Tracking circuit 300 includes a plurality of tracking cells 310[1], 310[2], . . . , 310[X] coupled in series, where X is a positive integer greater than 1. Tracking circuit 300 further includes a tracking bit line TKBL electrically coupled with a first tracking cell 310[1] of the tracking cells 310[1] . . . 310[X], a tracking word line TKWL electrically coupled with tracking cells 310[1] . . . 310[X], and a reference voltage node 320 electrically coupled with a last tracking cell 310[X] of the tracking cells 310[1] . . . 310[X]. Voltage reference node 320 is configured to carry a reference voltage. In some embodiments, reference voltage node 320 corresponds to reference node 130 in FIG. 1.

In some embodiments, tracking cells 310 are a sub-set of all available tracking cells in a memory circuit, such as memory circuit 100. In some embodiments, X is equal to or less than the number of cells in a column N. In some embodiments, if the tracking circuit 300 occupies Y columns, X is equal to or less than N·Y.

In some embodiments, tracking word line TKWL corresponds to tracking word line TKWL in FIG. 1. In some embodiments, tracking bit line TKBL corresponds to tracking bit line in FIG. 1. Tracking bit line TKBL in FIG. 3 is depicted as a capacitive load device 330 observable from the series-connected tracking cells 310[1] . . . 310[X]. Capacitive load device 330 represents at least the parasitic capacitance of bit line TKBL between reference voltage node 320 and a node 330a, where a first tracking cell 310[1] of the series-connected tracking cells 310[1] . . . 310[X] is coupled with tracking bit line TKBL.

Each tracking cell of the series-connected tracking cells 310[1] . . . 310[X] includes a corresponding cell transistor 312[1], 312[2], . . . , or 312[X] (also collectively referred to as "cell transistors 312"). In some embodiments, cell transistors 312 are NMOS transistors having the same predetermined transistor configuration as cell transistor 230 in FIGS. 2A-2C. In some embodiments, tracking cell transistors 312 are a sub-set of all available tracking cell transistors in memory circuit 100.

Each cell transistor of cell transistors 312 has a source terminal, a drain terminal, and a gate terminal. Cell transistors 312 are coupled in series between node 330a and reference voltage node 320. A drain terminal of the first cell transistor 312[1] is coupled with tracking bit line TKBL at node 330a. A source terminal of the last cell transistor 312[X] is coupled with reference voltage node 320. Otherwise, a source terminal of an i-th cell transistor 320[i] is coupled with a drain terminal of an (i+1)-th transistor 312[i+1], where index "i" is an integer and 1≤i≤(X−1). Gate terminals of cell transistors 312[1], 312[2], . . . , and 312[X] are coupled with tracking word line TKWL.

In a read operation, node 330a is charged to the predetermined pre-charge voltage level. Tracking word line TKWL is then applied with the activation voltage level sufficient to turn on cell transistors 312. When cell transistors 312 are turned on, cell transistors 312 function as a transistor that has an equivalent channel length greater than the channel length of an individual cell transistor of cell transistors 312 and thus has a smaller equivalent cell current than the cell current of an individual cell transistor of cell transistors 312 if operated separately. The equivalent cell current of cell transistors 312 discharges node 330a toward the predetermined reference voltage level of voltage reference node 320.

Cell transistors 312 are configured such that cell transistors 312 collectively model a cell transistor of a weak memory cell that stores the first predetermined logical value. As such, a time period spent for discharging the tracking bit line TKBL (as represented by a signal at node 330a) is usable to model a time period that is about the same or longer than the time period needed for a weak memory cell to discharge the corresponding bit line BL. Therefore, in some embodiments, the signal at node 330a is used as a tracking signal, and a time period from the activation of tracking word line TKWL until a voltage level at node 330a reaches a predetermined threshold voltage after node 330a begins to be discharged toward the predetermined reference voltage level is usable as the waiting period for reading memory cells 200A, 200B, or 200C. In some embodiments, a control circuit of the memory circuit (not shown) generates a reset signal based on the waiting period as indicated by the tracking signal at node 330a.

Figure 4:
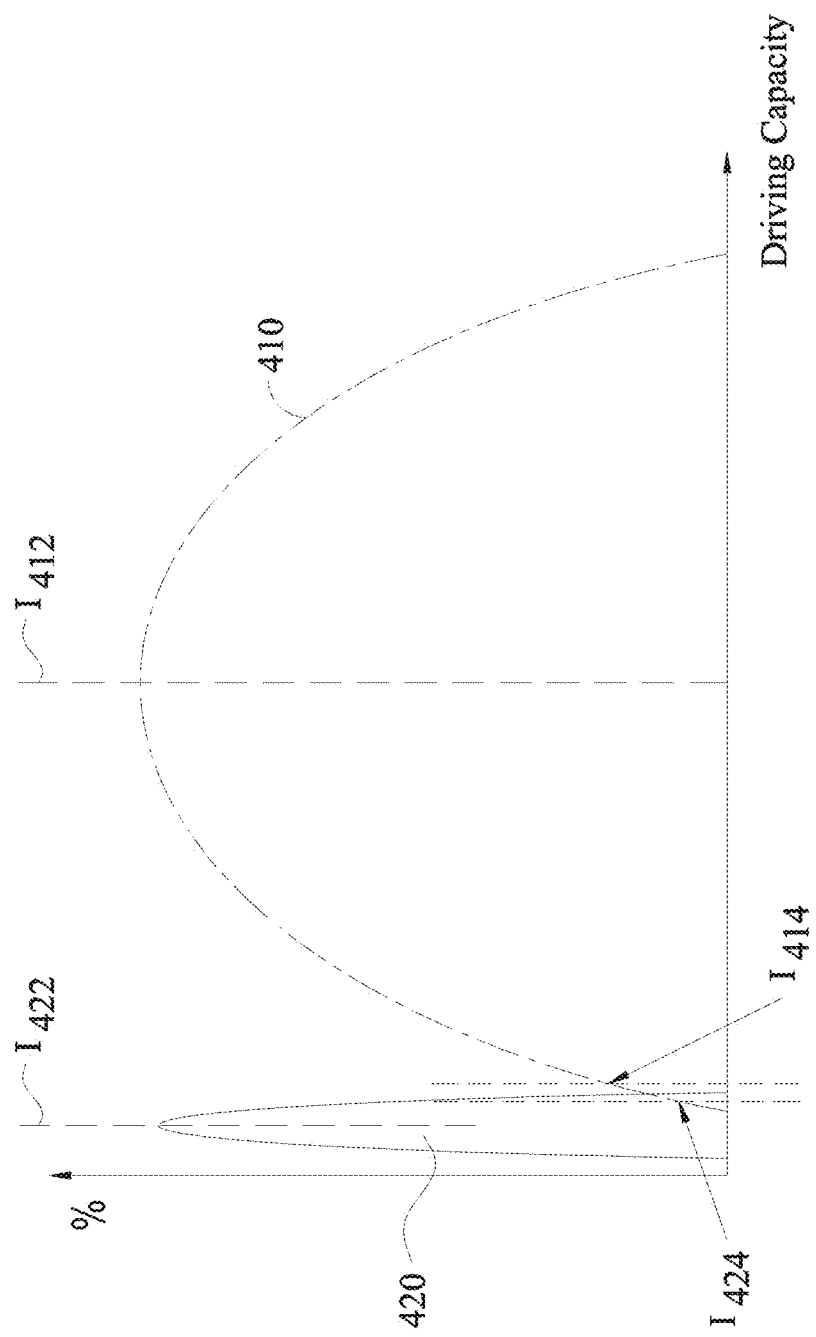
FIG. 4 is a graph of statistical distributions of the memory cells and the tracking circuit of a memory circuit in accordance with some embodiments.

FIG. 4 is a graph of statistical distributions of the driving capacity of the memory cells, such as memory cell 200A-200C, and the driving capacity of the tracking circuit, such as tracking circuit 300, of a memory circuit in accordance with some embodiments. In FIG. 4, the horizontal axis represents the driving capacity, which is measurable based on the cell current of a cell transistor of a memory cell or the equivalent cell current of the series-connected cell transistors of a tracking circuit. The vertical axis represents the percentage of memory cells or tracking circuits that would have the indicated driving capacity.

Curve 410 represents the memory cell statistical distribution of the cell transistors of memory cells under a predetermined operation setting. The predetermined operation setting includes at least a predetermined supply voltage and a predetermined pre-charge voltage level for corresponding bit lines. In some embodiments, the memory cell statistical distribution 410 is based on a statistical analysis of memory cells over a plurality of wafers or fabrication batches. The memory cell statistical distribution 410 has an average cell current value $I_{412}$, a standard deviation $\sigma_{410}$, and a weak bit current value $I_{414}$. The weak bit current value $I_{414}$ is less than the average cell current value $I_{412}$ and corresponds to a predetermined multiple of the standard deviations $\sigma_{410}$ of the memory cell statistical distribution 410. In some embodiments, the predetermined multiple of the standard deviations refers to 3 to 6 standard deviations $\sigma_{410}$.

Curve 420 represents the tracking cell statistical distribution of the equivalent transistors of the tracking circuit under the predetermined operation setting. In some embodiments, the tracking cell statistical distribution 420 is based on a statistical analysis of tracking circuits over the plurality of wafers or fabrication batches on which the statistical analysis of memory cells is based. The tracking cell statistical distribution 420 has an average cell current value $I_{422}$, a standard deviation $\sigma_{420}$, and a strong bit current value $I_{424}$. The strong bit current value $I_{424}$ is greater than the average cell current value $I_{422}$ and corresponds to the predetermined multiple of the standard deviations $\sigma_{420}$ of the tracking cell statistical distribution 420.

Cell transistors 312 are fabricated with the cell transistors of the memory cells and are thus have a distribution similar to curve 410 when the tracking cell transistors are analyzed individually. However, as illustrated in conjunction with FIG. 3, the series-connected cell transistors 312 function as a transistor having a longer equivalent channel length. Therefore, compared with distribution 410, the distribution 420 of series-connected cell transistors 312 thus compressed and left-shifted along the horizontal axis in the chart depicted in FIG. 4. As a result, the series-connected cell transistors 312 collectively are usable to model a weak memory cell in the statistic distribution of the memory cells 410.

In some embodiments, a number of the tracking cells X in tracking circuit 300 is set to cause the strong bit current value $I_{424}$ of the tracking cell statistical distribution 420 to be equal to or less than the weak bit current value $I_{414}$ of the memory cell statistical distribution 410. In some embodiments, a number of the tracking cells X in tracking circuit 300 is not sufficient to cause the strong bit current value $I_{424}$ to be equal to or less than the weak bit current value $I_{414}$, but the gap therebetween is sufficient small that is bridged by an additional delay circuit, or curable by the inherent delay of the tracking circuit without using any additional delay circuit.

Figure 5A:
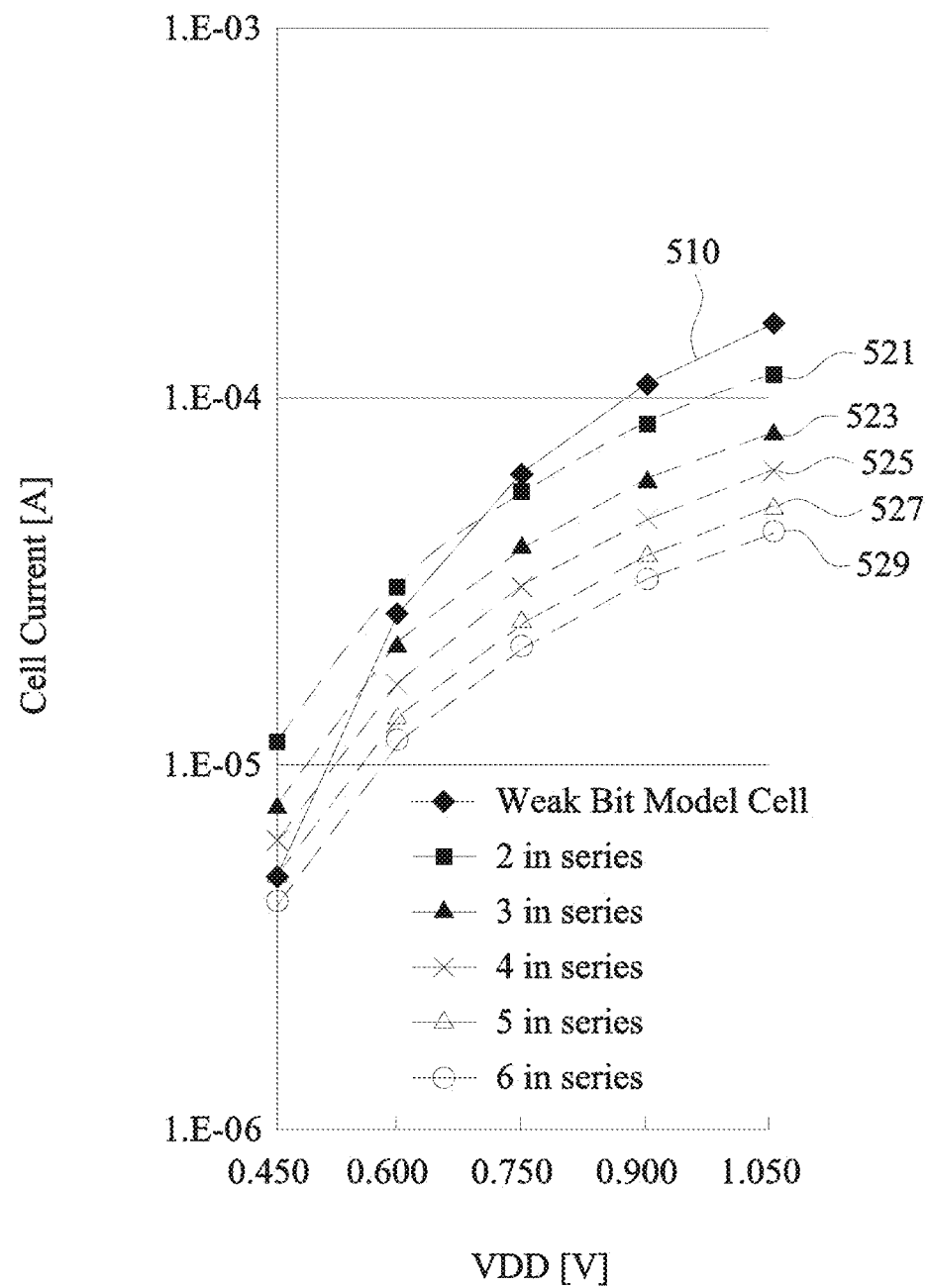
FIG. 5A is a graph of cell currents of a weak memory cell model and a tracking circuit with various configurations under a slow corner scenario in accordance with some embodiments.

FIG. 5A is a graph of cell currents of a weak memory cell model and a tracking circuit with various configurations under a slow corner scenario in accordance with some embodiments. The weak memory cell model cell is determined based on the statistical distribution of memory cells and a predetermined multiple of standard deviations as illustrated in conjunction with FIG. 4. Curve 510 represents the cell current of the weak memory cell model at various power supply voltage VDD. Curves 521-529 represent the cell current of the tracking circuit having 2 to 6 series-connected tracking cells.

Depending on the predetermined operation setting or a range of the predetermined operation setting, the number X of series-connected tracking cell transistors of the tracking circuit is set to be sufficient to cause the strong bit current value $I_{424}$ to be equal to or less than the weak bit current value $I_{414}$ as illustrated in conjunction with FIG. 4. In some embodiments according to FIG. 5A, when the power supply voltage VDD of the memory circuit is set to be 1.050V, setting the number of the tracking cells X in tracking circuit 300 as 2 would be sufficient. However, when the power supply voltage VDD is set to be 0.450 V, the number of the tracking cells X in tracking circuit 300 needs to be at least 6.

Figure 5B:
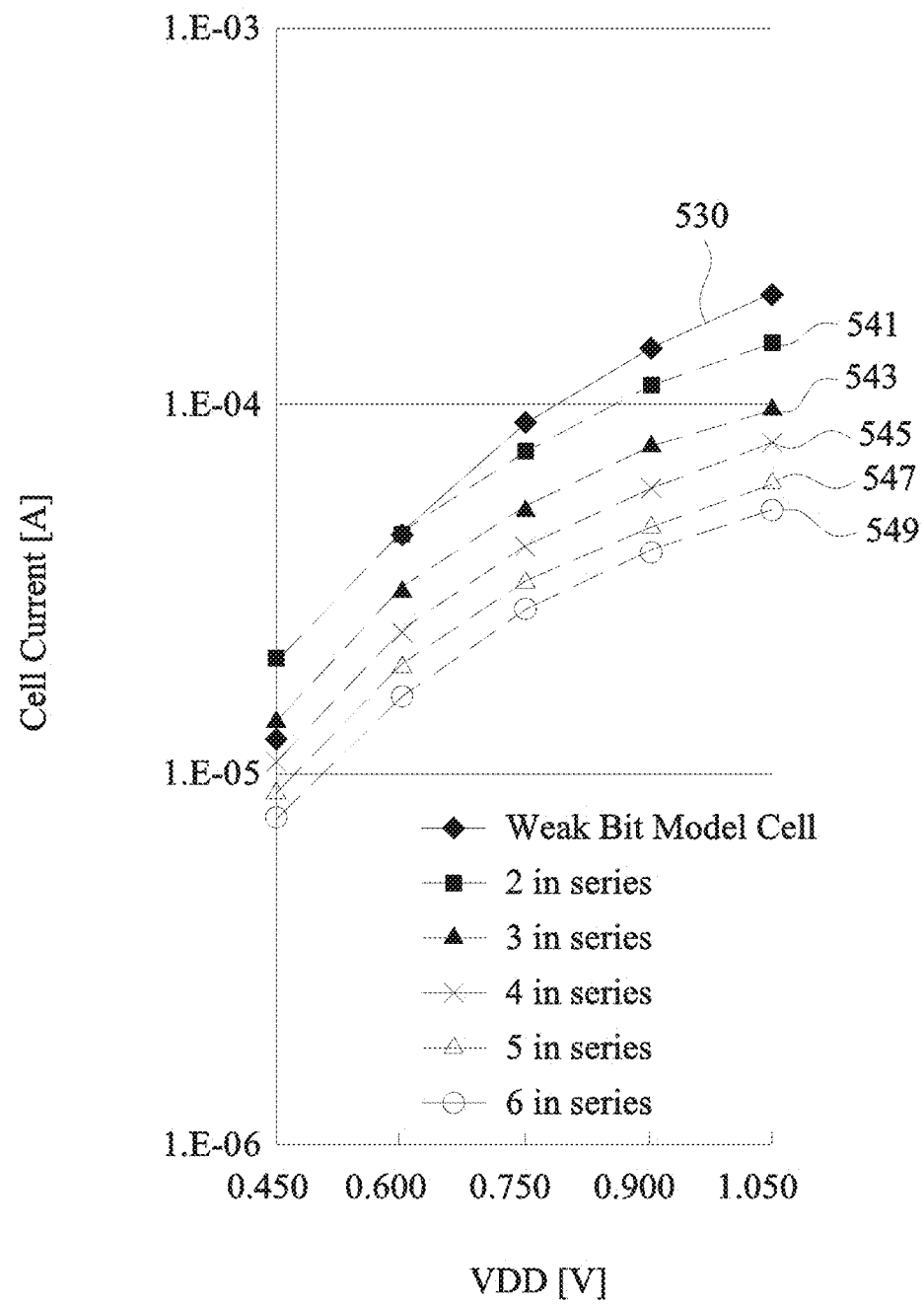
FIG. 5B is a graph of cell currents of a weak memory cell model and a tracking circuit with various configurations under a fast corner scenario in accordance with some embodiments.

FIG. 5B is a graph of cell currents of a weak memory cell model and a tracking circuit with various configurations under a fast corner scenario in accordance with some embodiments. The weak memory cell model cell is determined based on the statistical distribution of memory cells and a predetermined multiple of standard deviations as illustrated in conjunction with FIG. 4. Curve 530 represents the cell current of the weak memory cell model cell at various power supply voltage VDD. Curves 541-549 represent the cell current of the tracking circuit having 2 to 6 series-connected tracking cells.

In some embodiments, after the number X of series-connected tracking cells is determined based on the analysis of the slow corner scenario (such as FIG. 5A), a follow-up analysis based on the fast corner scenario is performed in order to ensure that the number X of series-connected tracking cell transistors of the tracking circuit is still sufficient to cause the strong bit current value $I_{424}$ to be equal to or less than the weak bit current value $I_{414}$ under the fast corner scenario. As shown in FIG. 5B, compared with curve 510 versus curves 521-529, curve 530 is further elevated versus curves 541-549 along the vertical axis. In other words, in some embodiments according to FIG. 5A and FIG. 5B, compared with the slow corner scenario, in the fast corner scenario the weak bit current value $I_{414}$ of the memory cells increases by an amount greater than those of the strong bit current value $I_{424}$ of the tracking circuit. Therefore, the number X set based on the slow corner scenario is still applicable to the fast corner scenario.

Figure 6A:
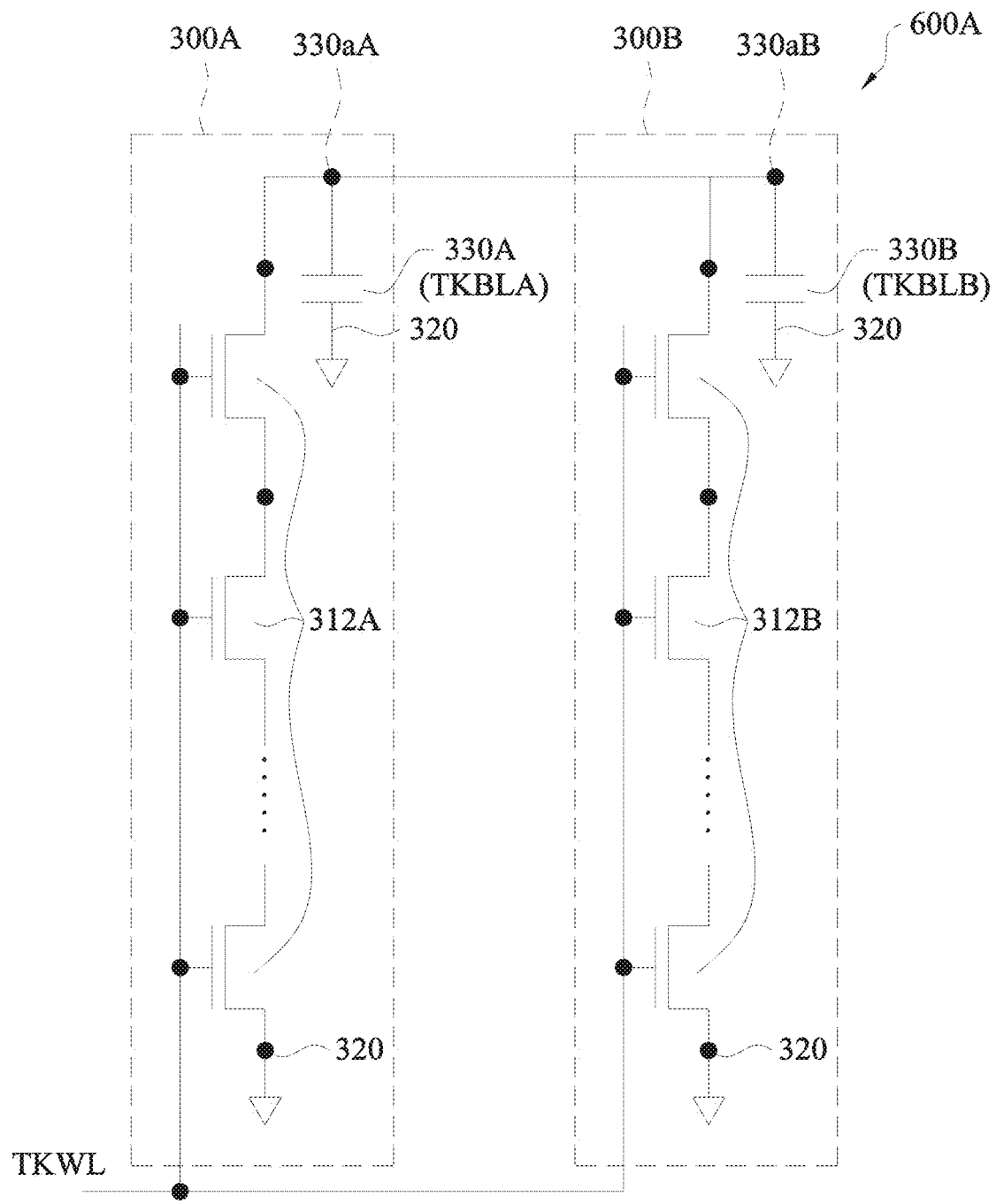
FIGS. 6A-6C are circuit diagrams of other example tracking circuits usable in the memory circuit in FIG. 1 in accordance with some embodiments.

FIG. 6A is a circuit diagram of another example tracking circuit 600A usable in the memory circuit in FIG. 1 in accordance with some embodiments. Tracking circuit 600A includes two parallel-coupled tracking circuits 300A and 300B each having a configuration similar to tracking circuit 300. The components in tracking circuits 300A and 300B that are the same or similar to those in tracking circuit 300 are given the same reference numbers followed by a notation A or B. Detailed description of some of the components is thus omitted.

Tracking circuits 300A includes a set of series-connected cell transistors 312A between node 330aA and node 320, which is coupled with a tracking bit line TKBLA represented by the capacitive load device 330A in FIG. 6A at node 332aA. Gate terminals of series-connected cell transistors 312A are coupled with tracking word line TKWL. Tracking circuits 300B includes a set of series-connected cell transistors 312B between node 330aB and node 320, which is coupled with a tracking bit line TKBLB represented by the capacitive load device 330B in FIG. 6A at node 332aB. Gate terminals of series-connected cell transistors 312B are coupled with tracking word line TKWL. Node 330aA and node 330aB are also electrically coupled together. In a read operation, nodes 330aA and 330aB are charged to the predetermined pre-charge voltage level as illustrated in conjunction with FIG. 3, and then tracking word line TKWL is activated to discharge the tracking bit lines TKBLA and TKBLB through series-connected cell transistors 312A and 312B.

In some embodiments, tracking bit line TKBLA and tracking bit line TKBLB, and the N bit lines BL[1], BL[2], . . . , BL[N] in FIG. 1 are fabricated based on layout patterns having the same size and shape. Therefore, the resulting tracking bit lines TKBLA, TKBLB, and bit lines BL[1], BL[2], . . . , BL[N] have comparable dimensions.

Only two sets of tracking circuits 300A and 300B are depicted in FIG. 6A. In some embodiments, tracking circuit 600A includes more than two parallel-coupled tracking circuits 300. In some embodiments, each tracking circuit of parallel-coupled tracking circuits 300A or 300B is formed based on a different column of tracking cells. In some embodiments, the different columns of tracking cells are spatially spaced apart in order to average the cell current variations and/or bit line loading variations throughout an entire memory circuit.

Figure 6B:
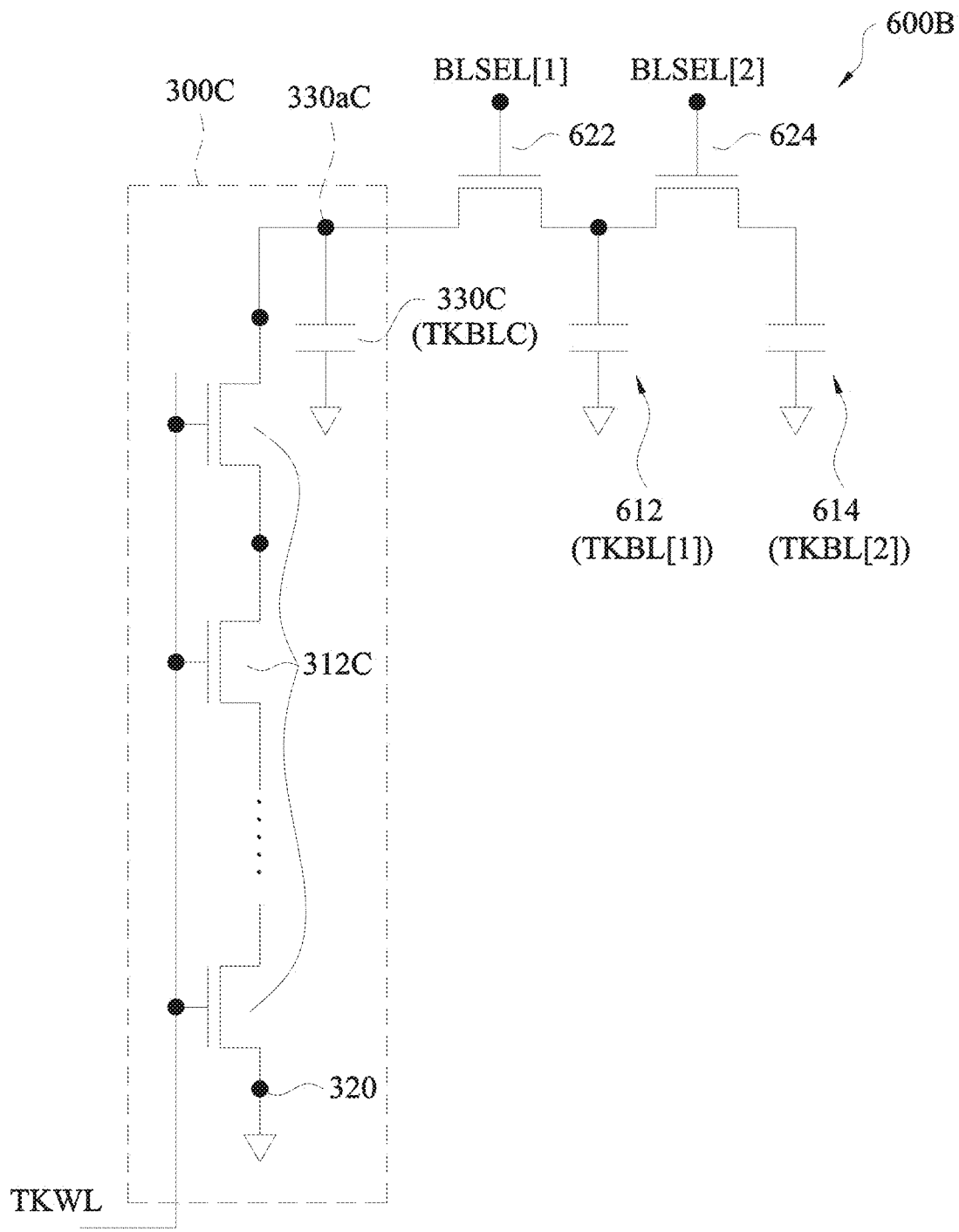

FIG. 6B is a circuit diagram of another example tracking circuit 600B usable in the memory circuit in FIG. 1 in accordance with some embodiments. Tracking circuit 600B includes a tracking circuits 300C having a configuration similar to tracking circuit 300. The components in tracking circuit 300C that are the same or similar to those in tracking circuit 300 are given the same reference numbers followed by a notation C. Detailed description of some of the components is thus omitted.

Tracking circuits 300C includes a set of series-connected cell transistors 312C between node 330aC and node 320, which is coupled with a tracking bit line TKBLC represented by the capacitive load device 330C in FIG. 6B at node 332aC. Gate terminals of series-connected cell transistors 312C are coupled with tracking word line TKWL.

Tracking circuit 600B further includes additional tracking bit lines TKBL[1] and TKBL[2] represented by capacitive load devices 612 and 614. Tracking circuit 600B also includes switch device 622 coupled between tracking bit line TKBLC and tracking bit line TKBL[1] and switch device 624 coupled between tracking bit line TKBL[2] and tracking bit line TKBL[2]. Switch devices 622 and 624 are controlled by control signals BLSEL[1] and BLSEL[2]. Switch devices 622 and 624 are configured to selectively couple a predetermined number of the load devices 330C, 612, and 614 with node 330aC. For example, when switch device 622 is turned off, only load device 330C is coupled with node 330aC. When switch device 622 is turned on and switch device 624 is turned off, load devices 330C and 612 are coupled with node 330aC. When switch devices 622 and 624 are turned on, load devices 330C, 612, and 614 are coupled with node 330aC. A wait period determinable by the signal at node 330aC is thus programmable by adjusting the number of load devices (i.e., the number of tracking bit lines) that are electrically coupled with node 330aC. In some embodiments, increasing the number of load devices prolongs the wait period.

In some embodiments, tracking bit lines TKBLC, TKBL [1], and TKBL[2], and the N bit lines BL[1], BL[2], ..., BL[N] in FIG. 1 are fabricated based on layout patterns having the same size and shape. Therefore, the resulting tracking bit lines TKBLC, TKBL[1], TKBL[2], and bit lines BL[1], BL[2], ..., BL[N] have comparable dimensions.

Figure 6C:
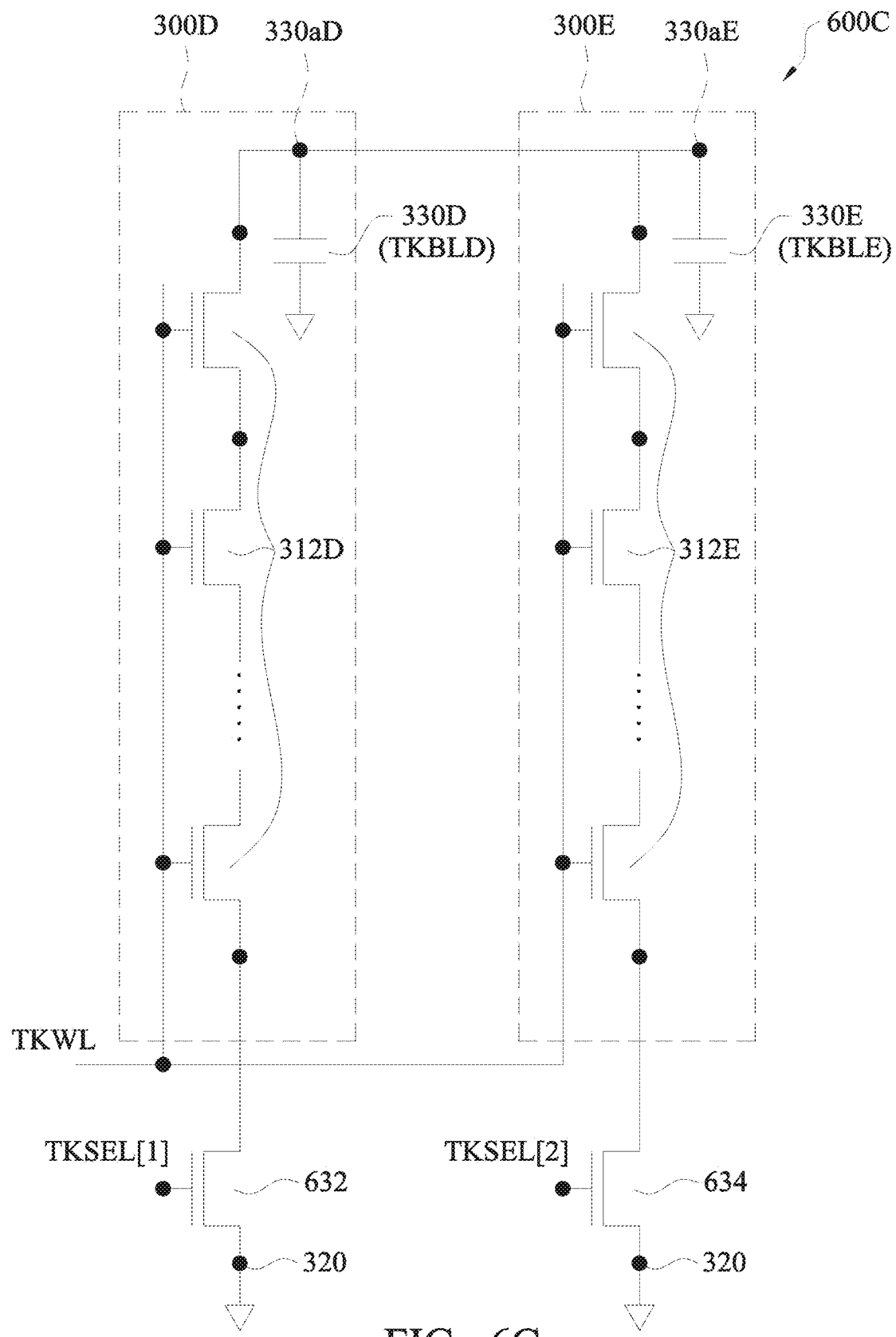

FIG. 6C is a circuit diagram of another example tracking circuit 600C usable in the memory circuit in FIG. 1 in accordance with some embodiments. Tracking circuit 600C includes two parallel-coupled tracking circuits 300D and 300E each having a configuration similar to tracking circuit 300. The components in tracking circuits 300D and 300E that are the same or similar to those in tracking circuit 300 are given the same reference numbers followed by a notation D or E. Detailed description of some of the components is thus omitted.

Tracking circuits 300D includes a set of series-connected cell transistors 312D between node 330aD and node 320, which is coupled with a tracking bit line TKBLD represented by the capacitive load device 330D in FIG. 6C at node 332aD. Gate terminals of series-connected cell transistors 312D are coupled with tracking word line TKWL. Tracking circuits 300E includes a set of series-connected cell transistors 312E between node 330aE and node 320, which is coupled with a tracking bit line TKBLE represented by the capacitive load device 330E in FIG. 6C at node 332aW. Gate terminals of series-connected cell transistors 312E are coupled with tracking word line TKWL.

Moreover, tracking circuit 600C includes a switch device 632 coupled between the series-connected cell transistors 312D and node 320 and a switch device 634 coupled between the series-connected cell transistors 312E and node 320. Switch devices 632 and 634 are controlled by control signals TKSEL[1] and TKSEL[2]. Switch devices 632 and 634 are configured to enable one of the tracking circuit 300D or 300E. In some embodiments, the set of series-connected cell transistors 312D and the set of series-connected cell transistors 312E include different number of cell transistors. Therefore, the waiting periods indicated by the tracking signals at nodes 330aD and 330aE generated by tracking circuit 300D and tracking circuit 300E are different. Switch devices 632 and 634 are usable to enable to tracking circuit 300D or 300E that corresponds to the less number of series-connected cell transistors that is still sufficient to model the weak bit current value under various operation settings.

In some embodiments, tracking bit lines TKBLD and TKBLE, and the N bit lines BL[1], BL[2], ..., BL[N] in FIG. 1 are fabricated based on layout patterns having the same size and shape. Therefore, and the resulting tracking bit lines TKBLD, TKBLE, and bit lines BL[1], BL[2], ..., BL[N] thus have comparable dimensions.

Only two sets of tracking circuits 300D and 300D and their corresponding switch devices 632 and 634 are depicted in FIG. 6C. In some embodiments, tracking circuit 600C includes more than two tracking circuits 300 that include different number of series-connected cell transistors.

The example tracking circuits 600A-600C illustrate three different approaches to implement a tracking circuit based on tracking circuit 300 in FIG. 3. In some embodiments, a tracking circuit is implemented based on a combination of two or more approaches of the three different approaches as demonstrated by example tracking circuits 600A-600C.

Figure 7:
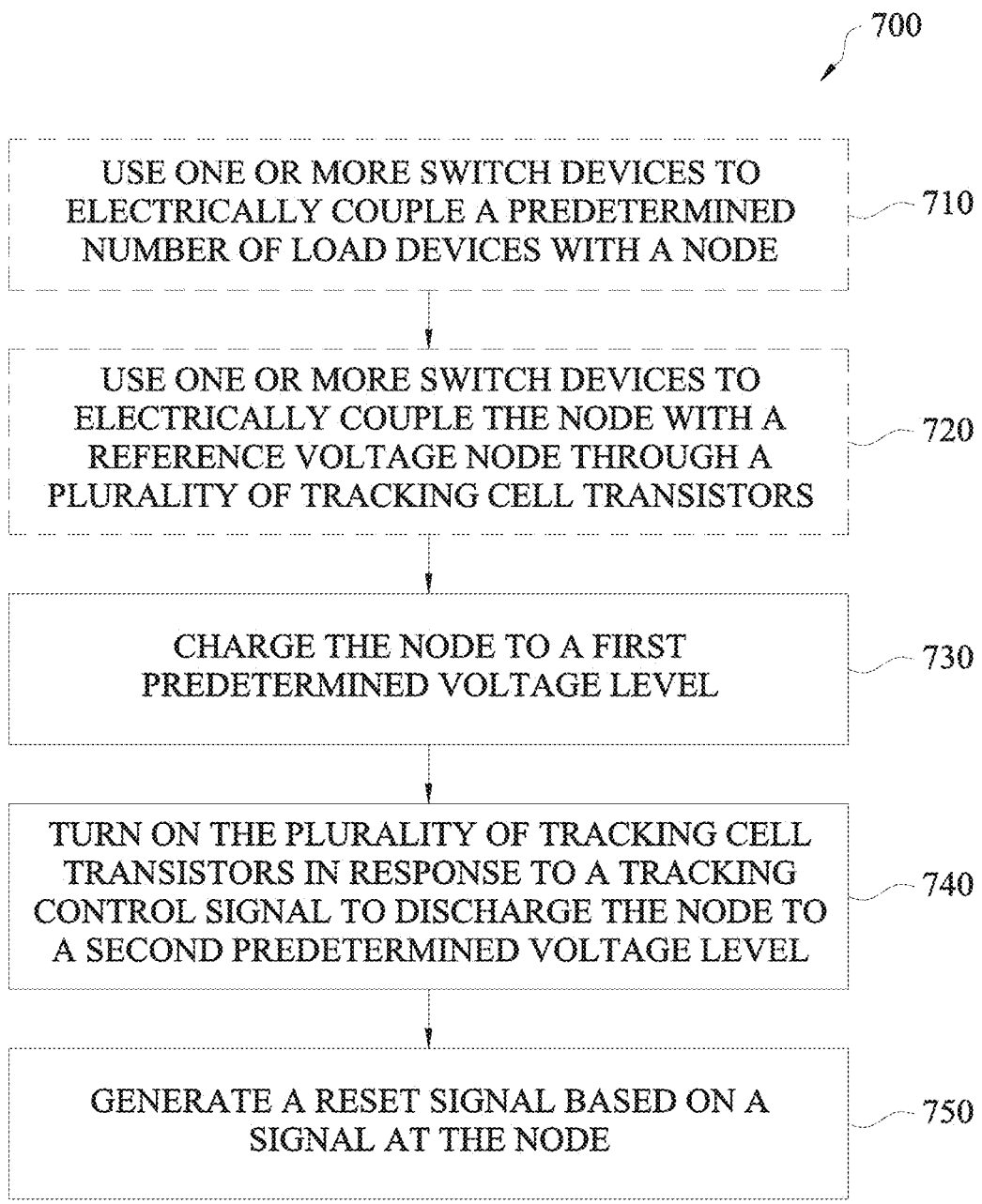
FIG. 7 is a flow chart of a method of operating a tracking circuit in accordance with some embodiments.

FIG. 7 is a flow chart of a method 700 of operating a tracking circuit in accordance with some embodiments. In some embodiments, method 700 is usable for operating tracking circuits 300, 600A, 600B, or 600C. It is understood that additional operations may be performed before, during, and/or after the method 700 depicted in FIG. 7, and that some other processes may only be briefly described herein.

The method 700 begins with operation 710, where one or more switch devices are used to electrically couple a predetermined number of load devices with a node. For example, in some embodiments according to tracking circuit 600B, switch devices 622 and 624 are controlled by signals BLSEL[1] and BLSEL[2] to electrically couple a predetermined number of load devices 330C, 612, or 614 with node 330aC. In some embodiments, if the tracking circuit lacks of a configuration similar to that of tracking circuit 600B, operation 710 is omitted.

The method 700 proceeds to operation 720, where one or more switch devices are used to select one set of two or more sets of series-connected tracking cell transistors and electrically couple the selected set of series-connected tracking cell transistors with a reference voltage node. For example, in some embodiments according to tracking circuit 600C, switch devices 632 and 634 are controlled by signals TKSEL [1] and TKSEL [2] to electrically couple one of tracking circuits 300D and 300E with reference voltage node 320. In some embodiments, if the tracking circuit lacks of a configuration similar to that of tracking circuit 600C, operation 720 is omitted.

The method 700 proceeds to operation 730, where the node where the load device coupled with the tracking cell transistors is charged to a predetermined pre-charge voltage level. For example, node 330a of tracking circuit 300 is charged to the predetermined pre-charge voltage level. In some embodiments, when the operation voltage of the corresponding memory circuit has a voltage level VDD, the pre-charge voltage level is set to be 100%, 75%, or 50% of VDD.

The method 700 proceeds to operation 740, where the series-connected tracking cell transistors are turned on responsive to a tracking control signal in order to discharge the node toward a reference voltage level at a reference voltage node. For example, node 330a of tracking circuit 300 is discharged toward the reference voltage level at reference voltage node 320 through transistors 312.

The method 700 proceeds to operation 750, where a control circuit of the memory circuit (not shown) generates a reset signal based on a waiting period as indicated by the signal at node 330a.

In an embodiment, a memory circuit includes: memory cells arranged in a array, each memory cell including a storage cell transistor corresponding to a predetermined transistor configuration; a first tracking bit line; a first tracking word line; a reference voltage node, a first terminal of the first tracking bit line being electrically coupled to the reference voltage node; and a tracking circuit electrically coupled between the first tracking word line and the reference voltage node, the tracking circuit including a first set of first tracking cells, each first tracking cell including a first cell transistor corresponding to the predetermined transistor configuration, gate terminals of the first cell transistors being electrically coupled with the first tracking word line; and wherein: a driving capacity of the storage cell transistors of the memory cells has a storage cell statistical distribution under a predetermined operation setting which exhibits a weak bit current value; a driving capacity of the first cell transistors of the first set of tracking cells has a first tracking cell statistical distribution under the predetermined operation setting which exhibits a first strong bit current value; and a first quantity of the first tracking cells is sufficient to cause the first strong bit current value of the first tracking cell statistical distribution to be equal to or less than the weak bit current value of the memory cell statistical distribution. In an embodiment, the cell transistors are N-type metal-oxide semiconductor field effect transistors. In an embodiment, the tracking circuit further includes a second tracking bit line, a second tracking word line and a second set of second tracking cells, each second tracking cell including a second cell transistor corresponding to the predetermined transistor configuration, gate terminals of the second cell transistors being electrically coupled with the second tracking word line; a driving capacity of the second cell transistors of the second set of tracking cells has a second tracking cell statistical distribution under the predetermined operation setting which exhibits a second strong bit current value; and a second quantity of the second tracking cells is sufficient to cause the second strong bit current value of the second tracking cell statistical distribution to be equal to or less than the weak bit current value of the memory cell statistical distribution. In an embodiment, the storage cell statistical distribution corresponds to a predetermined operation setting, the storage cell statistical distribution further exhibiting an average current value and a standard deviation; the weak bit current value corresponds to a predetermined multiple of standard deviation of the storage cell statistical distribution below the average current value of the storage cell statistical distribution; the second tracking cell statistical distribution corresponds to the predetermined operation setting, the second tracking cell statistical distribution further exhibits a second average current value and a second standard deviation; the second strong bit current value corresponds to the predetermined multiple of the second standard deviation of the second tracking cell statistical distribution above the second average current value of the second tracking cell statistical distribution; and a second quantity of the second tracking cells is sufficient to cause the second strong bit current value of the second tracking cell statistical distribution to be equal to or less than the weak bit current value of the memory cell statistical distribution. In an embodiment, the second cell transistors are electrically coupled in series between the second tracking bit line and the reference voltage node. In an embodiment, the first tracking bit line is electrically coupled with the second tracking bit line; and the first tracking word line is electrically coupled with the second tracking word line. In an embodiment, the first quantity of the first tracking cells is different than the second quantity of the second tracking cells; the first tracking word line is electrically coupled with the second tracking word line; and the tracking circuit further includes a first switch device electrically coupled between the first set of tracking cells and the reference node and controlled by a first control signal, and a second switch device electrically coupled between the second set of tracking cells and the reference node and controlled by a second control signal. In an embodiment, the tracking circuit further includes: a second tracking bit line; and a switch device electrically coupled between the first tracking bit line and the second tracking bit line and controlled by a control signal. In an embodiment, the first tracking bit line and the second tracking bit line have comparable dimensions. In an embodiment, the memory circuit further includes memory bit lines, and wherein: the array of memory cells is further arranged into columns of memory cells; each memory bit line is electrically coupled with a corresponding one of the columns of memory cells; and the first tracking bit line and one of the memory bit lines have comparable dimensions. In an embodiment, the first cell transistors are electrically coupled in series between the first tracking bit line and the reference voltage node. In an embodiment, the storage cell statistical distribution corresponds to a predetermined operation setting, the storage cell statistical distribution further exhibiting an average current value and a standard deviation; the weak bit current value corresponds to a predetermined multiple of standard deviation of the storage cell statistical distribution below the average current value of the storage cell statistical distribution; the first tracking cell statistical distribution corresponds to the predetermined operation setting, the first tracking cell statistical distribution further exhibiting a first average current value and a first standard deviation; and the first strong bit current value corresponds to the predetermined multiple of the first standard deviation of the first tracking cell statistical distribution above the first average current value of the first tracking cell statistical distribution.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory circuit comprising:
   memory cells arranged in an array, each memory cell including a storage transistor corresponding to a predetermined transistor configuration;
   a first tracking bit line;
   a first tracking word line;
   a reference voltage node, a first terminal of the first tracking bit line being electrically coupled to the reference voltage node; and
   a tracking circuit electrically coupled between an intermediary node of the first tracking bit line and the reference voltage node, the tracking circuit including:
      a first set of first tracking cells, each first tracking cell including a first shadow transistor corresponding to the predetermined transistor configuration, gate terminals of the first shadow transistors being electrically coupled with the first tracking word line; and wherein:
  a driving capacity of the storage transistors has a memory cell statistical distribution under a predetermined operation setting which exhibits a weak bit current value;
  a driving capacity of the first shadow transistors has a first tracking cell statistical distribution under the predetermined operation setting which exhibits a first strong bit current value; and
  a first quantity of the first tracking cells is sufficient to cause the first strong bit current value of the first tracking cell statistical distribution to be equal to or less than the weak bit current value of the memory cell statistical distribution.

2. The memory circuit of claim 1, wherein the first shadow transistors are N-type metal-oxide semiconductor field effect transistors.

3. The memory circuit of claim 1, wherein:
  the tracking circuit further includes:
    a second tracking bit line;
    a second tracking word line; and
    a second set of second tracking cells, each second tracking cell including a second shadow transistor corresponding to the predetermined transistor configuration, gate terminals of the second shadow transistors being electrically coupled with the second tracking word line;
  a driving capacity of the second shadow transistors has a second tracking cell statistical distribution under the predetermined operation setting which exhibits a second strong bit current value; and
  a second quantity of the second tracking cells is sufficient to cause the second strong bit current value of the second tracking cell statistical distribution to be equal to or less than the weak bit current value of the memory cell statistical distribution.

4. The memory circuit of claim 3, wherein:
  the memory cell statistical distribution further exhibits an average current value and a first standard deviation;
  the weak bit current value corresponds to a predetermined multiple applied to the first standard deviation of the memory cell statistical distribution below the average current value of the memory cell statistical distribution;
  the second tracking cell statistical distribution further exhibits a second average current value and a second standard deviation;
  the second strong bit current value corresponds to the predetermined multiple applied to the second standard deviation of the second tracking cell statistical distribution above the second average current value of the second tracking cell statistical distribution; and
  the second quantity of the second tracking cells is sufficient to cause the second strong bit current value of the second tracking cell statistical distribution to be equal to or less than the weak bit current value of the memory cell statistical distribution.

5. The memory circuit of claim 3, wherein:
  the second shadow transistors are electrically coupled in series between the second tracking bit line and the reference voltage node.

6. The memory circuit of claim 3, wherein:
  the first tracking bit line is electrically coupled with the second tracking bit line; and
  the first tracking word line is electrically coupled with the second tracking word line.

7. The memory circuit of claim 3, wherein:
  the first quantity of the first tracking cells is different than the second quantity of the second tracking cells;
  the first tracking word line is electrically coupled with the second tracking word line; and
  the tracking circuit further includes:
    a first switch device electrically coupled between the first set of first tracking cells and a reference node and controlled by a first control signal; and
    a second switch device electrically coupled between the second set of second tracking cells and the reference node and controlled by a second control signal.

8. The memory circuit of claim 1, wherein the tracking circuit further includes:
  a second tracking bit line; and
  a switch device electrically coupled between the first tracking bit line and the second tracking bit line and controlled by a control signal.

9. The memory circuit of claim 8, wherein:
  the first tracking bit line and the second tracking bit line have comparable dimensions.

10. The memory circuit of claim 1, further comprising:
  memory bit lines; and
  wherein:
    the array of memory cells is further arranged into columns of memory cells;
    each memory bit line is electrically coupled with a corresponding one of the columns of memory cells; and
    the first tracking bit line and one of the memory bit lines have comparable dimensions.

11. The memory circuit of claim 1, wherein:
  the first shadow transistors are electrically coupled in series between the first tracking bit line and the reference voltage node.

12. The memory circuit of claim 1, wherein:
  the memory cell statistical distribution further exhibits an average current value and a first standard deviation;
  the weak bit current value corresponds to a predetermined multiple applied to the first standard deviation of the memory cell statistical distribution below the average current value of the memory cell statistical distribution;
  the first tracking cell statistical distribution further exhibits a first average current value and a second standard deviation; and
  the first strong bit current value corresponds to the predetermined multiple applied to the second standard deviation of the first tracking cell statistical distribution above the first average current value of the first tracking cell statistical distribution.

13. A tracking circuit, comprising:
  a first tracking bit line representing a first capacitive load;
  a reference voltage node; and
  a first set of first tracking cells electrically coupled between a first intermediary node of the first tracking bit line and the reference voltage node;
    each first tracking cell including a first shadow transistor substantially corresponding to a predetermined transistor configuration having a first channel length;
    gate terminals of the first shadow transistors being electrically coupled with a first tracking word line; and
    the first shadow transistors being arranged in a configuration which functionally represents a single first transistor having a second channel length substantially equivalent to an aggregate combination of the first channel lengths of the first shadow transistors.

14. The tracking circuit of claim 13, further comprising:
a second tracking bit line representing a second capacitive load; and
a second set of second tracking cells electrically coupled between a second intermediary node of the second tracking bit line and the reference voltage node;
  each second tracking cell including a second shadow transistor substantially corresponding to the predetermined transistor configuration having the first channel length;
  gate terminals of the second shadow transistors being electrically coupled with the first tracking word line; and
  the second shadow transistors being arranged in a configuration which functionally represents a single transistor having a second channel length substantially equivalent to an aggregate combination of the first channel lengths of the second shadow transistors.

15. The tracking circuit of claim 14, wherein:
the first intermediary node is electrically coupled with the second intermediary node;
the tracking circuit further comprises:
  a first switch device electrically coupled between the first set of first tracking cells and a reference node; and
  a second switch device electrically coupled between the second set of second tracking cells and the reference node; and
the first switch device and the second switch device are controlled by one or correspondingly more control signals which are different from a signal on the first tracking word line.

16. The tracking circuit of claim 14, wherein:
the first set of first tracking cells has a first number of first shadow transistors; and
the second set of second tracking cells has a second number of second shadow transistors, the second number being different than the first number.

17. A memory circuit, comprising:
memory cells, each memory cell including a cell transistor corresponding to a predetermined transistor configuration; and
a tracking circuit including:
  a first tracking bit line;
  a reference voltage node; and
  a first set of first tracking transistors electrically coupled between a first intermediary node of the first tracking bit line and the reference voltage node;
  each first tracking transistor substantially corresponding to a predetermined transistor configuration having a first channel length;
  gate terminals of the first tracking transistors being electrically coupled with a tracking word line; and
  the first tracking transistors being arranged in a configuration which functionally represents a single first transistor having a second channel length substantially equivalent to an aggregate combination of the first channel lengths of the first tracking transistors.

18. The memory circuit of claim 17, wherein the tracking circuit further includes:
a second tracking bit line; and
a second set of second tracking transistors electrically coupled between a second intermediary node of the second tracking bit line and the reference voltage node;
  each second tracking transistor substantially corresponding to the predetermined transistor configuration having the first channel length;
  gate terminals of the second tracking transistors being electrically coupled with the tracking word line; and
  the second tracking transistors being arranged in a configuration which functionally represents a single second transistor having a third channel length substantially equivalent to an aggregate combination of the first channel lengths of the second tracking transistors.

19. The memory circuit of claim 18, further comprising:
a first switch device coupled between the first set of first tracking transistors and a reference node; and
a second switch device coupled between the second set of second tracking transistors and the reference node; and
wherein:
  the first switch device and the second switch device are controlled by one or correspondingly more control signals different from a signal on the tracking word line; and
  the first intermediary node is electrically coupled with the second intermediary node.

20. The memory circuit of claim 18, further comprising:
a second tracking bit line; and
a switch device coupled between the first tracking bit line and the second tracking bit line and controlled by a control signal.

* * * * *